United States Patent
Ito et al.

(10) Patent No.: US 8,167,629 B2
(45) Date of Patent: May 1, 2012

(54) ELECTRONIC DEVICE

(75) Inventors: Dai Ito, Kiyosu (JP); Takayoshi Honda, Nagoya (JP); Mitsuhiko Mizuno, Kasugai (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 12/926,537

(22) Filed: Nov. 24, 2010

(65) Prior Publication Data

US 2011/0189870 A1  Aug. 4, 2011

(30) Foreign Application Priority Data

Feb. 3, 2010  (JP) .................................. 2010-22490

(51) Int. Cl.
*H01R 12/00* (2006.01)

(52) U.S. Cl. ........................................... 439/78; 439/736

(58) Field of Classification Search .............. 439/78–83, 439/567, 736
See application file for complete search history.

(56) References Cited

U.S. PATENT DOCUMENTS

| 7,422,444 | B1 * | 9/2008 | Johnescu ........................ 439/78 |
| 2009/0176402 | A1 | 7/2009 | Honda |
| 2009/0191730 | A1 | 7/2009 | Ito et al. |

FOREIGN PATENT DOCUMENTS

| JP | A-09-283196 | 10/1997 |
| JP | A-2000-195596 | 7/2000 |

* cited by examiner

*Primary Examiner* — Khiem Nguyen
(74) *Attorney, Agent, or Firm* — Posz Law Group, PLC

(57) ABSTRACT

An electronic device has: a connector having plural kinds of terminals with respectively different cross section shapes; and a substrate having a plurality of through-holes with lands formed therein. In the electronic device, a width W1 of an insertion portion of the first terminal, a width W2 of an insertion portion of the second terminal, a land-inclusive hole diameter D1 of the first through-hole, and a land-inclusive hole diameter D2 of the second through-hole are configured to fulfill conditions of W1<W2, D1<D2, and W2−W1>D2−D1, for the improvement of connection reliability between the land and the terminal while restraining dropping of reflow solder in a connector mounting process.

12 Claims, 9 Drawing Sheets

US 8,167,629 B2

ELECTRONIC DEVICE

CROSS REFERENCE TO RELATED APPLICATION

The present application is based on and claims the benefit of priority of Japanese Patent Application No. 2010-22490, filed on Feb. 3, 2010, the disclosure of which is incorporated herein by reference.

FIELD OF THE INVENTION

The present invention generally relates to an electronic device of insertion mount structure of a connector having its terminals inserted in through-holes and soldered to lands formed on walls of the through-holes.

BACKGROUND INFORMATION

Conventionally, as an electronic device of insertion mount structure, a connector terminal inserted in the through-hole of a circuit board (i.e., a substrate) and soldered to a land formed on a wall of a through-hole is known, for example, as shown in a patent document 1. In the present electronic device, a part of the insertion portion (i.e., an insertion mounting portion) of the terminal is inserted in the through-hole, and the insertion portion is connected electrically and mechanically to a land that is formed on a wall of the through-hole (i.e., a wall part of the land) by reflow soldering.

When the insertion mount structure is adopted, a contact area between the solder, the terminal and the land can be more securely reserved without increasing circuit board volume along the circuit board surface direction, in comparison to the surface mount structure. In other words, connection reliability between the solder, the terminal and the land is improved than the surface mount structure.

In addition, in the insertion mount structure, electronic parts and wiring can be arranged more closer to the through-holes on a back side of a connector mount surface of the circuit board by reflow soldering, in comparison to flow soldering. Further, when electronic parts are surface-mounted on the connector mount surface of the circuit board, the connector and the electronic parts can be simultaneously mounted on the circuit board by reflow soldering.

Some of the electronic devices have, as disclosed in a patent document 2, two kinds of connector terminals having respectively different diameters, such as a signal terminal for signal transmission and a power terminal for electric power transmission with a greater diameter than that of the signal terminal. In this case, a diameter of a through-hole in which the power terminal is inserted is greater than a diameter of a through-hole in which the signal terminal is inserted.

[Patent document 1] Japanese Patent Laid-Open No. 2009-182141 (also published as US2009/0191730)
[Patent document 2] Japanese Patent Laid-Open No. 2009-163991 (also published as US2009/0176402)

The electronic device of insertion mount structure disclosed in the patent document 2 has different through-hole diameters for different kinds of terminals. Therefore, solder 14 is filled to a deeper position of a through-hole 33 having a greater diameter than a through-hole 34 having a smaller diameter as shown in FIG. 1A, when solder paste is applied on the connector mount surface of the circuit board in a screen-printing process by reflow soldering.

Therefore, depending on an amount of filling in the through-hole, there may be a case where the solder 14 in the through-hole 33 having the greater diameter being pushed by the insertion portion of the connector (e.g., an insertion portion of a power terminal) as shown in FIG. 1B drops from a circuit board 30 out of the through-hole 33 as shown in FIG. 1C, when insertion portions 43a, 43b of the connector terminals are respectively inserted in the corresponding through-holes 33, 34.

In FIG. 1C, the illustration shows that the melted solder 14 is dropping from a through-hole at a time of reflow. In FIG. 1B, the illustration shows that the solder 14 in paste form is dropping at a time of inserting the insertion portion 43a of the terminal in the through-hole.

In contrast, dropping of the solder 14 can be restrained at a time of insertion of the insertion portion 43a of the terminal or at a time of reflow as shown in FIGS. 2B and 2C, by decreasing the amount of filling of the paste form solder 14 in the greater through-hole 33, as shown in FIG. 2A, through adjustment of printing pressure and/or printing speed of the print process.

However, because the amount of filling of the paste form solder 14 in the smaller through-hole 34 is decreased at the same time in the course of the above adjustment as shown in FIG. 2A, there may be a case where there is not a sufficient amount of the solder 14 in the through-hole 34 for providing reliability of the connection between the insertion portion 44a of the terminal and a land 36 at a time of reflow as shown in FIG. 2C.

SUMMARY OF THE INVENTION

In view of the above and other problems, the present invention provides an electronic device with a plural kinds of terminals having respectively different cross sections to be soldered on lands on the walls of the through-holes, with secured connection reliability between the terminals and lands, together with restraining dropping of the solder at a time of mounting components on a circuit board.

In an aspect of the present invention, an electronic device includes: a substrate (i.e., a circuit board) having a plurality of through-holes that pierce both sides of the substrate with lands formed on walls of the through-holes; and a connector having a housing made of electricity insulating material, the housing holding a part of each of a plurality of terminals, each of the plurality of terminals having another part defined as an insertion portion that is inserted into each of the plurality of through-holes. The insertion portions of the plurality of terminals are inserted in respectively different through-holes to be soldered to the lands on the walls of the through-holes. The connector has a plurality of terminals in respectively different plural kinds, formed by punching a metal plate of predetermined thickness; and the plurality of terminals have, as the insertion portions, respectively different along-the-surface cross sections that are in parallel with the surface of the substrate.

Further, conditions of $W1<W2$, $D1<D2$, and $W2-W1>D2-D1$ are fulfilled as a relationship between the plural kinds of terminals having respectively different cross sections and the plurality of through-holes in which the insertion portions of the plural kinds of terminals are inserted. As to variables of the above inequalities; (a) W1 and W2 are respectively defined as widths of the insertion portions of a first and a second terminal that have respectively different cross sections in at least one of two directions along the substrate surface when the two directions respectively corresponds to a thickness direction of the metal plate and a cross direction perpendicular to the thickness direction of the metal plate, and (b) D1 and D2 are respectively defined as a hole diameter of a first and a second through-hole in which the insertion portions of the first and the second terminal are inserted when the hole diameter is measured as an inside of the land of the respective through-holes.

That is, the difference between two through-holes, that is, the hole diameter of the second through-hole in which the second terminal is inserted and the hole diameter of the first through-hole in which the first terminal is inserted, is configured to be smaller than the width difference of the two insertion portions, that is, the insertion portion of the second terminal and the insertion portion of the first terminal. In other words, the above configuration of the present invention has a smaller hole diameter difference than a conventional configuration that fulfills a condition of $W2-W1 \leqq D2-D1$, in any one of two along-the-substrate-surface directions, which are either of the thickness direction of the metal plate or the cross direction that is perpendicular to the thickness direction of the metal plate.

Therefore, the difference of the solder amounts in the first through-hole and the second through-hole (i.e., the difference between two solder depths) is made smaller in the above configuration in comparison to the conventional configuration, when the paste form solder is pasted on the substrate surface of the connector mount surface, in the screen-printing process for reflow soldering of the insertion portion of the terminal to the corresponding land. Further, while the solder amount (i.e., solder depth) filled in the first through-hole is kept at a level that assures reliability of the connection between the first terminal and the land, the solder amount (i.e., solder depth) filled in the second through-hole is adjusted to a level that prevents dropping of the solder from the through-hole at a time of insertion of the second terminal in the second through-hole or at a time of reflow soldering after the insertion of the second terminal.

Thus, the electronic device of the present invention restrains the dropping of the solder at a time of mounting while providing sufficient connection reliability between the terminal and the land, even when the connector includes plural kinds of terminals with respectively different cross sections and the terminals in the connector are soldered to the lands on the walls of the through-holes.

Further, it is preferable that the plural kinds of terminals and the through-holes in which the insertion portions of the plural kinds of terminals are inserted are configured to fulfill the following conditions in only one of two directions, that is, the metal plate thickness direction and the perpendicular-to-the-thickness direction (i.e., the cross direction). The conditions $W1<W2$, $D1<D2$, $W2-W1>D2-D1$ are exclusively fulfilled in one of the plate thickness direction and the cross direction.

If the above conditions are fulfilled in both of the two directions (i.e., metal plate thickness direction and its perpendicular direction), the gap between the first through hole (i.e., a smaller hole) and the insertion portion of the first terminal becomes wide in all circumference of the insertion portion of the first terminal. Therefore, when the insertion portion of the terminal is soldered to the corresponding land by reflow soldering, the solder connection between the insertion portion of the terminal and the land becomes shorter in the substrate thickness direction after the reflow soldering.

In contrast, conditions $W1<W2$, $D1<D2$ and $W2-W1>D2-D1$ are configured to be fulfilled in only one of the two directions (i.e., a metal plate thickness direction and its perpendicular direction) in the present invention. Therefore, the solder connection between the first terminal and the first through-hole is made longer in the substrate thickness direction, to have the improved connection reliability between the terminal and the land.

Further, it is also preferable that the conditions of $W1<W2$, $D1<D2$, $W2-W1>D2-D1$ are fulfilled only in the plate thickness direction, when the terminals of plural kinds are inserted in the through-holes.

When a metal plate having a predetermined thickness is punched to form terminals, the terminal thickness is generally made to be same as the thickness of the metal plate at any position of the terminal. The "width" of the terminal in the thickness direction (i.e., the thickness of the metal plate) is thus determined by the engagement relationship to the connector on the opposite side (i.e., the connector of an external device).

In addition; if the thickness of the insertion portion is made thinner than other portions, the insertion portion must undergo a striking process or the like to be made thinner. However, the striking process makes the insertion portion weaker, more fragile or less precise in the thickness direction. Thus, the dimension of the insertion portion in the thickness direction has a smaller degree of freedom, in comparison to the direction that is perpendicular to the thickness direction.

Therefore, the conditions $W1<W2$, $D1<D2$, $W2-W1>D2-D1$ are configured to be fulfilled only in the thickness direction having a smaller degree of freedom in terms of the dimension of the terminal, among the two directions (i.e., a metal plate thickness direction and its perpendicular direction), and the above conditions are configured to be not fulfilled in the perpendicular direction having a greater degree of dimension freedom. Thus, the solder connection between the first terminal and the land is made longer in the first through-hole, which has a smaller hole diameter, to improve the connection reliability.

Further, it is preferable that, when only two kinds of terminals are used and the cross section of the through-hole along the substrate surface is substantially circular, the insertion portion of the first terminal is configured to have a longer width (i.e., dimension) in the perpendicular-to-the-thickness direction (i.e., the cross direction) than a width (i.e., dimension) in the metal plate thickness direction, if those widths are measured along the substrate surface direction.

According to the above configuration, the gap between the first, through-hole and the first terminal becomes smaller in the perpendicular-to-the-thickness direction (i.e., the cross direction) in comparison to the metal plate thickness direction. Therefore, the conditions $W1<W2$, $D1<D2$, $W2-W1>D2-D1$ are fulfilled and the gap between the first through-hole and the first terminal is made smaller at the same time in the metal plate thickness direction, thereby increasing the solder connection between the first terminal and the land on the first through-hole and improving the connection reliability.

Further, it is preferable that, when only two kinds of terminals are used and the cross section of the through-hole along the substrate surface is substantially circular, the insertion portion of the second terminal is configured to have a same width (i.e., dimension) in both of the perpendicular-to-the-thickness direction (i.e., the cross direction) and the metal plate thickness direction, if the width are measured along the substrate surface direction.

According to the above configuration, the gap between the insertion portion of the second terminal and the second through-hole has substantially the same width in both of the two directions (i.e., the metal plate thickness direction and the cross direction). Therefore, the conditions $W1<W2$, $D1<D2$, $W2-W1>D2-D1$ are fulfilled and the gap between the second through-hole and the second terminal is made smaller at the same time, thereby increasing the solder connection between the second terminal and the land on the second through-hole and improving the connection reliability.

More practically, the two kinds of terminals may be a signal terminal for signal transmission and a power terminal for electric power transmission. In this case, the power terminal has a greater along-the-surface cross section size than the signal terminal. In this case, the signal terminal corresponds to the first terminal, and the power terminal corresponds to the second terminal.

Further, the connector has, in a pre-soldered condition (i.e., before soldering), a stay for fixing the housing at a predetermined position of a substrate thickness direction relative to the substrate, and each of the plurality of terminals has a stopper that has a width greater than the insertion portion in at least one direction along the substrate surface and is connected to a housing-side end of the insertion portion. The maximum width of the stopper is made to be greater than the hole diameter of the corresponding through-hole. In this case, the hole diameter of the corresponding through-hole is measured as a smaller value than the actual through-hole diameter by the thickness of the land.

For example, when a circuit board is warped convexly on the connector mount surface, the terminal is inserted in the through-hole until the stay fixes the connector at a predetermined position if there is no stopper. That is, a tip of the terminal protrudes largely from the back side of the circuit board (i.e., from the opposite side of the connector mount surface). In other words, the positions of the tips of the terminals vary terminal to terminal, depending on the warp of the circuit board. Thus, even when the condition of the screen-printing is the same, the dropping of the solder may be easier if the amount of protrusion of the tip of the terminal from the back side of the circuit board is greater.

In contrast, the stopper on the terminal in the present invention presses, in contact with the circuit board, the circuit board at a position of convex warp until the connector is brought to a predetermined position to correct the warp of the circuit board, when the circuit board has the convex warp. Thus, the variation of tip positions of the terminals on the back side of the circuit board is suppressed, thereby preventing troubles such as the dropping of the solder from the through-hole.

Further, it is preferable that the land has a wall portion that is disposed on a wall of the through-hole and a surface portion that surrounds the through-hole on a connector mount surface in connection with the wall portion, and the maximum width of the stopper is smaller than a distance between two extremes of an outer periphery of the solder-accessible surface portion when the surface portion extreme distance is measured along a measurement direction of the maximum width of the stopper.

When the above configuration is adopted, in reflow mounting process, the melted solder staying between the stopper and the surface portion of the land due to the capillary phenomenon is decreased, in comparison to a configuration where the maximum width of the stopper is greater than the distance between the two extremes of the outer periphery of the solder-accessible surface portion. That is, the amount of the melted solder flowing in the through-hole is increased. In other words, the connection reliability between the terminal and the land (i.e., the wall portion of the land) is improved.

Further, it is preferable that each of the plurality of through-holes having the plurality of terminals inserted therein has a circular along-the-surface cross section, and the insertion portion of each of the plurality of terminal kinds has an octagonal along-the-surface cross section.

When the cross section of the insertion portion of the terminal is a polygon, a corner between two sides of the polygon comes closest to the wall of the through-hole (i.e., the surface of the land). That is, a gap between the insertion portion of the terminal and a circular cross section of the wall of the through-hole (i.e., a surface of the land) takes the smallest value at the corners of the polygon, when the cross section of the insertion portion takes a polygonal shape. According to the present invention, the gap between the insertion portion of the terminal and the through-hole is generally made smaller because the terminal has a greater number of corners in the polygon-shaped cross section than the rectangular-shaped cross section. Thus, the solder connection between the terminal and the land is increased and the connection reliability is improved.

The above-described effects are expected when the number 'n' of corners in the polygon is greater than four (i.e., n>4). Especially, as in the present invention, it is easy and cost-effective to cut the four corners of the rectangular cross section of the terminal, which can be punched out from the metal plate, to have the octagonal cross section, in comparison to make the cross section in other polygonal shape.

Further, it is preferable that a cross section area size of the second terminal is greater than a cross section area size of the first terminal when the area size of the cross section is taken along the surface of the substrate, and an insertion length of the first terminal is greater than an insertion length of the second terminal when the insertion length of the terminal in the corresponding through-hole is measured as a length from a connector mount surface of the substrate to a tip of the inserted terminal.

According to the above configuration, because the less-rigid first terminal go into the first through-hole before the insertion of the second terminal in the second through-hole, an insertion force for inserting the first terminal is decreased. In other words, by configuring the first terminal to be longer than the second terminal, a "first stage" insertion force to insert a longer terminal prior to inserting a shorter terminal in a "second stage" can be decreased. In this manner, the scratch or the like on the land on the wall of the through-hole can be prevented.

Further, it is preferable that the connector has a position pin that has a base portion held by the housing and a tip portion extending along a substrate thickness direction, and the substrate has a pin-accepting hole in addition to the through-hole for accepting the position pin, and an insertion length of the position pin is greater than an insertion length of the plurality of terminals when the insertion length is measured as a length of the position pin or the plurality of terminals from a connector mount surface of the substrate to a tip of the inserted position pin or plurality of terminals.

According to the configuration thus far, an increased insertion force may be required due to the smaller gap between the second terminal and the wall of the second through-hole (i.e., the surface of the land) in at least one of the two directions among the along-the-surface directions.

In contrast, according to the above configuration, the position pin is inserted in the pin-accepting hole to accurately determine/correct the insertion position of the terminals on the surface of the substrate, prior to the insertion of the plurality of terminals in the through-holes, thereby allowing accurate insertion of the second terminal in the second through-hole, for the purpose of restraining the increase of the insertion force.

Further, it is preferable that the substrate has electronic components that can be surface-mounted on a connector mount surface. According to the above configuration, when the insertion portion of the terminal is mounted on the corresponding land by reflow process, the electronic components for surface-mounting and the connector (i.e., terminals) for insertion-mounting can both be mounted in the same reflow process. Thus, the manufacturing process can be simplified.

DETAILED DESCRIPTION

Figure 1A:
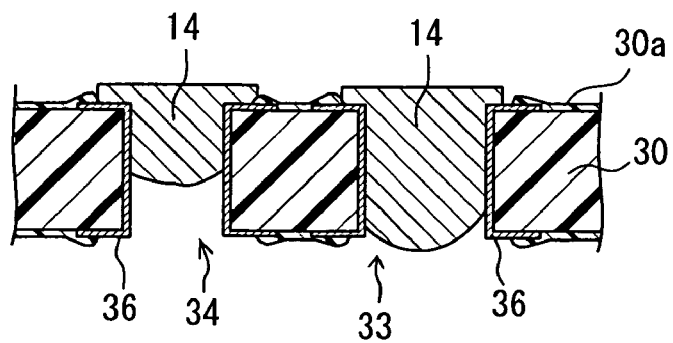
FIGS. 1A to 1C are cross sectional views of an electronic device for illustrating a conventional manufacturing process of the device having an insertion mounting structure in a screen printing step, in a connector mounting step, and in a reflow step.

An embodiment of the present invention is explained as follows based on the drawing.

First Embodiment

In the present embodiment, an electronic control unit of non-waterproofing structure used as an engine ECU (Electronic Control Unit) of a vehicle is taken as an example of an electronic device.

Figure 4:
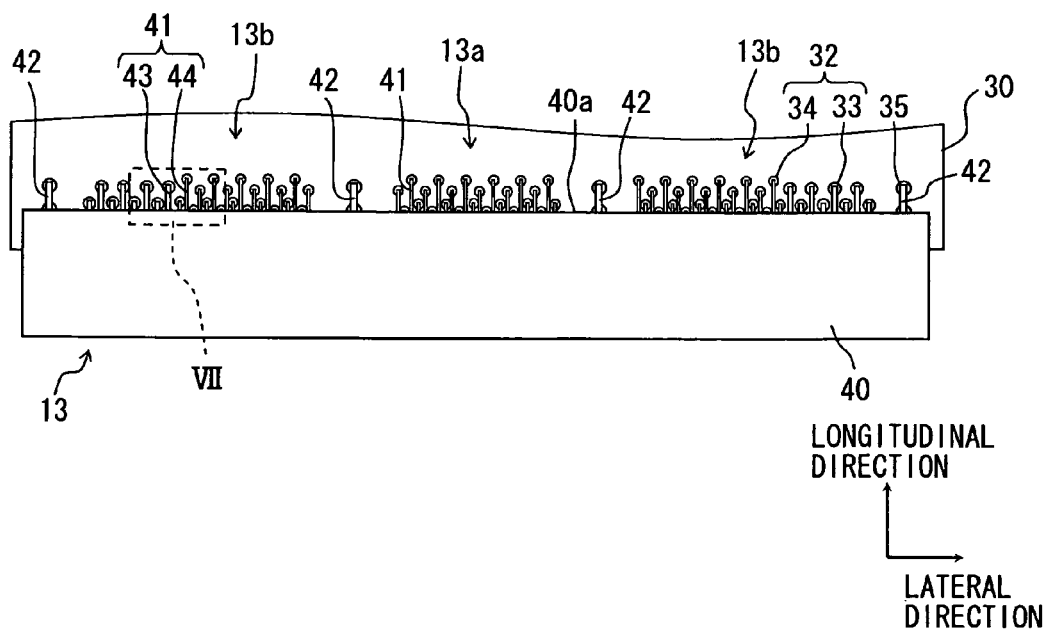
FIG. 4 is a top view of the electronic control unit with a connector mounted thereon in the embodiment of the present invention.
Figure 7:
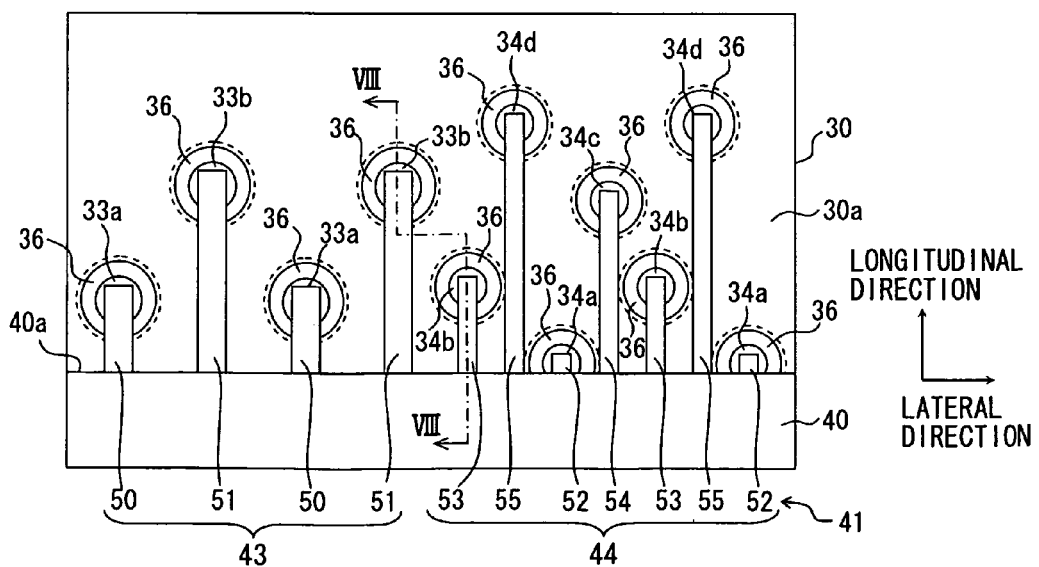
FIG. 7 is a top view of a portion of the electronic device in a rectangular broken line VII in FIG. 4.
Figure 8:
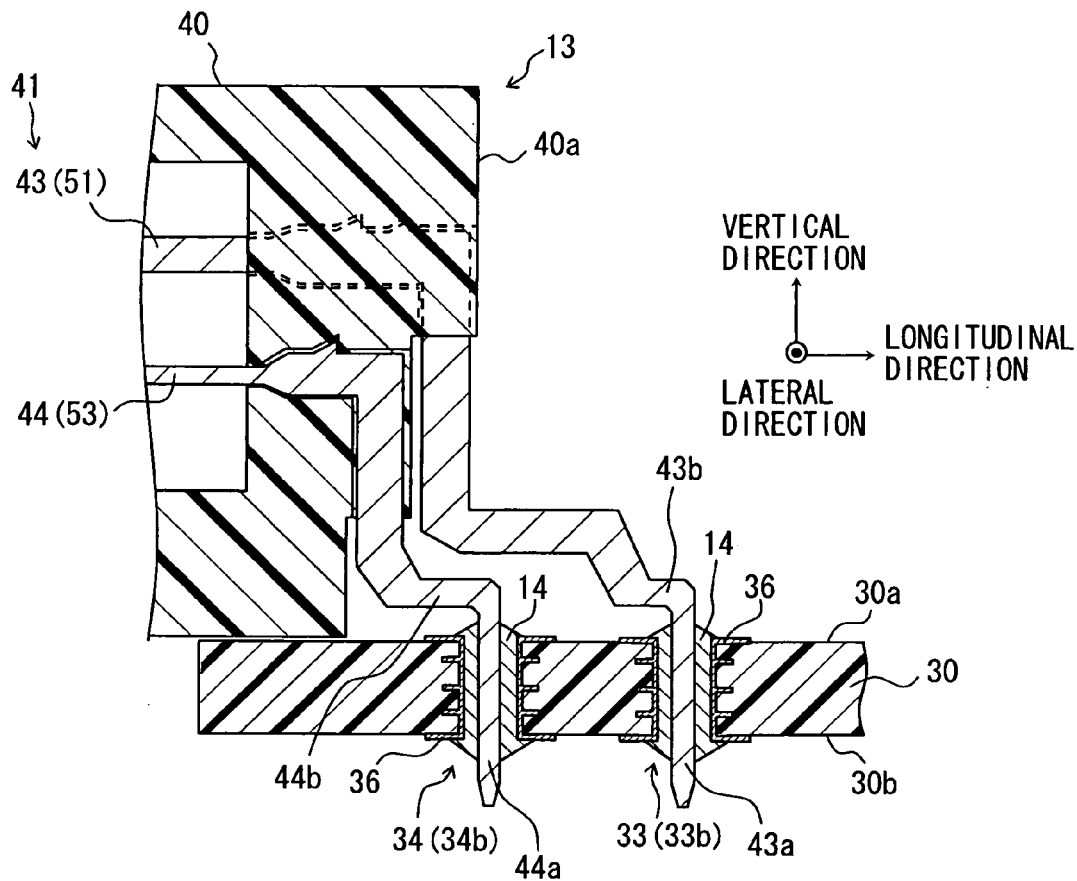
FIG. 8 is a cross sectional view of the electronic device along a VIII-VIII line in FIG. 7.

In addition, the direction of the electronic control unit is defined in the following manner. That is, as shown in FIG. 8, a circuit board thickness direction is defined as a vertical direction, and, as shown in FIGS. 4, 7, 8, a terminal arrangement direction of the connector housing (i.e., a longer side direction of the connector housing) is defined as a lateral (i.e., right-left) direction, and, a direction perpendicular to both of the vertical direction and the lateral direction (i.e., a shorter side direction of the connector housing) is defined as a longitudinal (i.e., front-back) direction.

In addition, in FIGS. 7, 9, 10, 12A/B, 14 to 16, 18, and 19, solder is not shown in the drawing. Further, in FIGS. 9, 12A/B, and 15, the insertion portion of the terminal is shown in a cross section.

Figure 3:
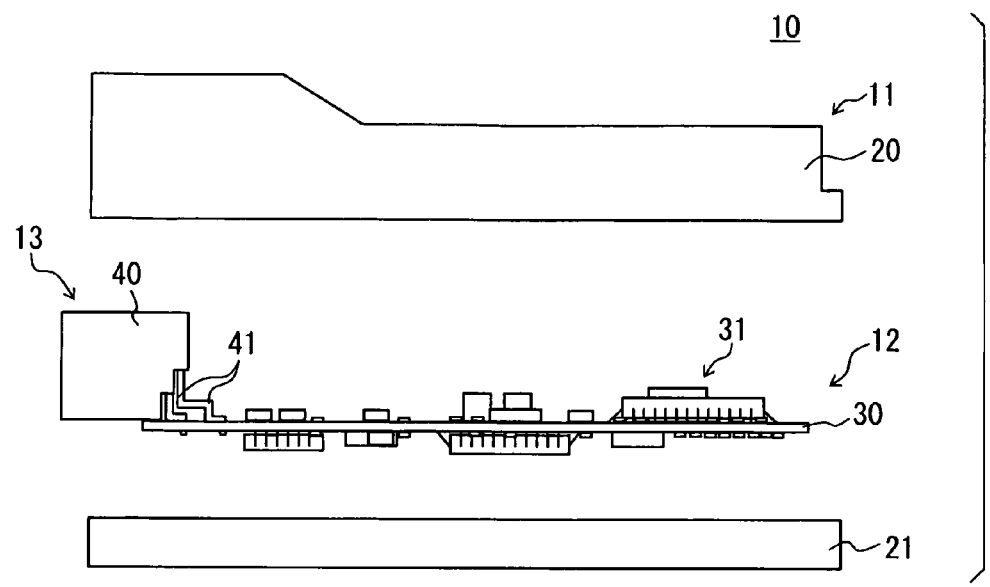
FIG. 3 is an exploded view of an electronic control unit in an embodiment of the present invention.

An ECU 10 shown in FIG. 3 includes, as its main components, a circuit board 12 and a connector 13 mounted thereon. In addition, a body 11 that covers the circuit board 12 and the connector 13 is included in the present embodiment. The ECU 10 has the same basic configuration as a unit shown in Japanese Patent Laid-Open No. 2009-163991 filed by the same applicant as the present application. Therefore, the following description puts its focus on the characteristic portion of the present invention, leaving other points to the disclosure of the above-identified application.

The body 11 made of metallic material (e.g., aluminum) or resin material accommodates part of the circuit board 12 and the connector 13 in an inside space for protection. The body 11 may be formed as a single piece, or may be formed as combination of plural pieces.

In the present embodiment, the body 11 is formed by two pieces, that is, a box shape case 20 having an opening on one side and a shallow cover 21 that covers the opening of the case 20, as shown in FIG. 3. By combining the case 20 and the cover 21, the body 11 having an inside space for accommodating the circuit board 12 and the connector 13 is formed.

The body 11 (i.e., the case 20) has a cutout portion that corresponds to the connector 13 (not shown in the drawing), and the body 11 partially includes a connection part between the circuit board 12 and terminals 41 of the connector 13 in its inside space and exposes another connection part between terminals 41 of the connector 13 and an external connector to an outside of the body 11.

Further, the case 20 and the cover 21 are combined to hold a substrate 30 at the periphery, for positioning the circuit board 12 at an appointed position in the body 11 (not shown in the drawing).

The circuit board 12 provides an electronic circuit of a microcomputer, a power transistor, a resistor, a capacitor, and the like, on the substrate 30 that holds wiring including the land as the electrode and via holes connecting between wirings, as shown in FIG. 3. The circuit board 12 (i.e., the substrate 30) has the connector 13 mounted thereon. Further, electronic components 31 mounted on a surface 30a of the substrate 30 include electronic components 31 of surface mount structure.

The substrate 30 has a though-hole extending vertically and penetrating its surface 30a and backside 30b. Some of the through-holes are provided as a through-hole 32, in which the terminal 41 of the connector 13 is inserted. The through-hole 32 has at least two kinds with respectively different area (i.e., opening) sizes along the cross section that is perpendicular to the vertical direction.

In the present embodiment, as the through-hole 32, two kinds of different through-holes 33, 34 having respectively different opening sizes are provided. The through-hole 33 having a greater opening size is a power through-hole for inserting a power terminal 43, and the through-hole 34 having a smaller opening size is a signal through-hole for inserting a signal terminal 44. Both of these through-holes 33, 34 have a circular shape cross section that is perpendicular to the vertical direction. Further, on a wall of the through-holes 33, 34, a land 36 is formed, as shown in FIG. 8. In the present embodiment, the land 36 is formed not only on the wall of the through-holes 33, 34 but also on the circumference of the opening of the surface 30a and the backside 30b of the substrate 30. The land 36 is formed by patterning of conductor foil or plating.

In the present embodiment, the focus is mainly put on a dimensional relationship between the through-holes 33, 34 on the substrate 30 and the insertion portions 43a, 44a of the terminals 43, 44. Details of the through-holes 33, 34 are mentioned later in the description.

The through-holes 33, 34 are arranged in a row from left to right in the lateral direction, and multiple rows of the through-holes 33, 34 are arranged in the longitudinal direction from back to front. Further, as shown in FIG. 7, the through-holes 33, 34 in each of the multiple rows are arranged in a hound tooth (i.e., staggered) manner.

The through-hole 33 for having the insertion portion 43a of the power terminal 43 inserted therein includes two rows of through-holes 33a, 33b arranged in the longitudinal direction (i.e., a front row and a back row), as shown in FIG. 7. The through-hole 33a is in the first row on a near side to the housing 40 of the connector 13 in the longitudinal direction, and the through-hole 33b is in the second row. These through-holes 33a, 33b are generally arranged from the left to the right, and in the staggered manner. That is, when seen from the left to the right, the through-hole 33a and the through-hole 33b appear alternatively one by one in the first and the second row.

The through-hole 34 for having the insertion portion 44a of the signal terminal 44 inserted therein includes four rows of through-holes 34a, 34b, 34c, 34d arranged in the longitudinal direction (i.e., a front row and a back row), as shown in FIG. 7. The through-hole 34a is in the first row on a near side to the housing 40 of the connector 13 in the longitudinal direction, and the through-hole 34b is in the second row, the through-hole 34c is in the third row, and the through-hole 34d is in the fourth row. These through-holes 34a to 34d are generally arranged from the left to the right, and in the staggered manner. That is, when seen from the left to the right, these through-holes 34a to 34d appear alternatively one by one, in an order of (a) the hole 34a in the first row, (b) the hole 34c in the third row, (c) the hole 34b in the second row, and (d) the hole 34d in the fourth row.

In addition, the substrate 30 has a through-hole 35 formed thereon, in which a hook pin 42 for reinforcement is inserted, as well as the above-mentioned through-hole 32 (i.e., through-holes 33, 34). The through-hole 35 is formed at four places from left to right in the present embodiment, as shown in FIG. 4. Further, at each of the four places, the through-hole 35 is bored at two positions at front and back in the longitudinal direction.

The connector 13 is a component that relays electrical signals between the circuit on the circuit board 12 and the external devices or other components, and is formed by a housing 40 made of dielectric material (e.g., resin) and a conductor made of conductor material, including multiple terminals 41.

The multiple terminals 41 respectively have, as a part of an extending portion extending from the housing 40, an insertion portion that is inserted in the corresponding through hole 32 (i.e., the through-holes 33, 34). In addition, the multiple terminals 41 include multiple kinds of terminals having respectively different cross section shapes in a direction along the surface 30a of the substrate 30. In the present embodiment, a power terminal 43 for electricity transmission and a signal terminal 44 for signal transmission are used as shown in FIGS. 4 to 8, as the multiple kinds of terminals with respectively different section shapes.

The power terminal 43 includes a power terminal 50 inserted in the through-hole 33a in the first row and a power terminal 51 inserted in the through-hole 33b in the second row. These power terminals 50, 51 having the same cross section shape and the same cross section size are represented by using a numeral '43' common to the power terminal, as shown in FIG. 8, when it actually shows the signal terminal 51.

Further, the signal terminal 44 includes a signal terminal 52 inserted in the through-hole 34a in the first row, a signal terminal 53 inserted in the through-hole 34b in the second row, a signal terminal 54 inserted in the through-hole 34c in the third row, and a signal terminal 55 inserted in the through-hole 34d in the fourth row. These signal terminals 52 to 55 having the same cross section shape and the same cross section size are represented by using a numeral '44' common to the signal terminal, as shown in FIG. 8, when it actually shows the signal terminal 53.

Figure 9:
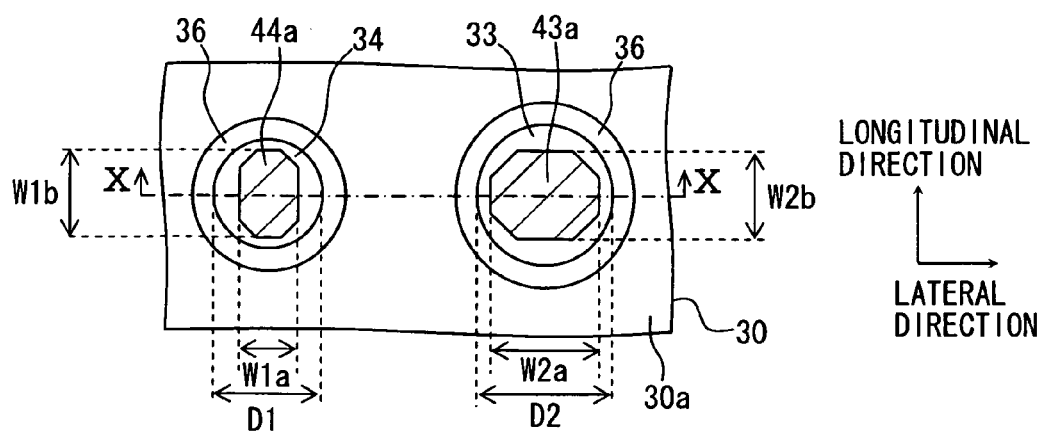
FIG. 9 is a top view of the electronic device for illustrating a relationship between a power terminal, a signal terminal and their corresponding through-holes.

The power terminal 43 and the signal terminal 44 respectively have, as an insertion portion to be inserted in the corresponding through-holes 33, 34, an insertion portion 43a and an insertion portion, 44a extending in the vertical direction. The cross sections of those insertion portions 43a, 44a taken on a plane that is perpendicular to the vertical direction (i.e., an along-the-surface cross section that is in parallel with the surface 30a of the substrate 30) respectively have an octagonal shape, as shown in FIG. 9.

In the present embodiment, the focus is mainly put on a dimensional relationship between the through-holes 33, 34 on the substrate 30 and the insertion portions 43a, 44a of the terminals 43, 44. Details of the insertion portions 43a, 44a are mentioned later in the description.

In the present embodiment, all of the power terminals 43 and the signal terminals 44 are, as a portion extending from the housing 40, as shown in FIG. 8, connected to the insertion portions 43a, 44a, to have a stopper 43b and a stopper 44b respectively protruding in a perpendicular direction relative to an extending direction of the insertion portions 43a, 44a. Details of the stoppers 43b, 44b are also mentioned later in the description.

Figure 5:
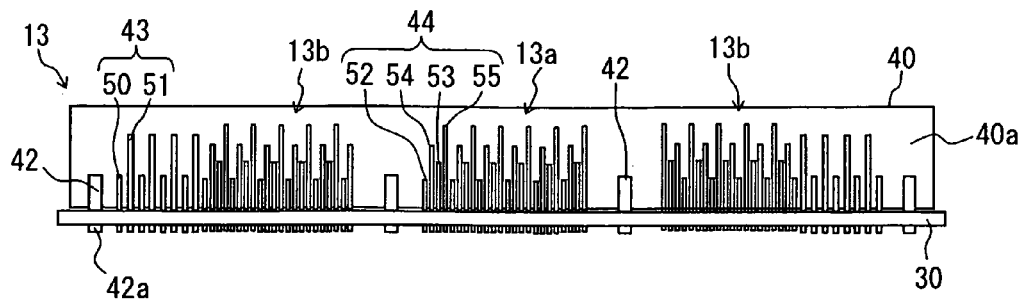
FIG. 5 is a side view of the electronic control unit with a connector mounted thereon seen from a connector terminal side in the embodiment of the present invention.
Figure 6:
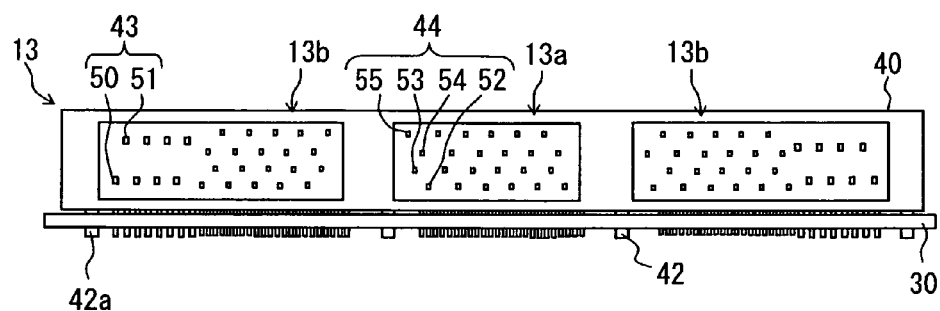
FIG. 6 is another side view of the electronic control unit with a connector mounted thereon seen from an external connector side in the embodiment of the present invention.

The housing 40 has a sideway-elongated shape, where the lateral dimension is longer than the longitudinal dimension. The multiple terminals 41 mentioned above are respectively held by the housing 40 at their ends so as not to interfere with each other. In addition, the multiple terminals 41 are arranged in the lateral direction along the longer side of the housing 40, as shown in FIGS. 4 to 6. In addition, the connector 13 has the terminals 41 mainly located on the surface 30a side of the substrate 30, and has the housing 40 mainly located on the surface 30a of the substrate 30. That means, the surface 30a of the substrate 30 is equivalent to a connector mount surface recited in claims.

In the present embodiment, the power terminals 43 (50, 51) are held in two rows in the vertical direction, and the signal terminals 44 (52 to 55) are held in four rows in the vertical direction, by the housing 40, as shown in FIGS. 5 and 6. In addition, as shown in FIGS. 4 to 6, to be connected to three external connectors for electrical connection to engine-related systems, terminals are grouped into three blocks. Three terminal blocks include one terminal block 13a and two terminal blocks 13b. The terminal block 13a is a collection of the signal terminals 44 (52 to 55) only, and the terminal block 13b is a collection of the signal terminals 44 (52 to 55) and the power terminals 43 (50, 51).

Furthermore, a locking part 42a (i.e., a nail) is prepared at a tip of the hook pin 42, as shown in FIGS. 4 to 6 in the present embodiment. The hook pin 42 temporarily holds the backside 30b of the substrate 30 in a condition of being inserted in the through-hole 35 on the substrate 30 by using the locking part 42a engaged with a circumference of the through-hole 35. The hook pin 42 is used for temporarily fixing the connector 13 on the substrate 30 until the connector 13 is mounted by reflow soldering. In addition, the connector 13 can be more strongly mounted on the substrate 30 by the hook pin 42 when a land is formed on the wall surface of the through-hole 35 and the hook pin 42 is soldered to the land. In this case, the hook pin 42 contributes to improved the connection reliability between the terminals 41 and the lands 36.

Now, the present description mentions the advantages of the present invention regarding the insertion portions 43a, 44a of the terminals 43, 44 as well as the through-holes 33, 34.

In the present embodiment, multiple kinds of terminals 43, 44, namely all of the terminals 41, are punched out from a metal plate of the predetermined thickness, to have a predetermined shape. Further, each of the terminals 41 (43, 44) is held by the housing 40 so that the thickness direction is aligned to the same direction. More practically, as shown in FIG. 9, the terminals 41 are held by the housing 40, as a flat plate without having any bending process, so that (a) the thickness direction is substantially aligned to the lateral direction (i.e., right-left direction, or the direction of the longer side of the housing 40), and (b) the direction perpendicular to the thickness direction (i.e., a width direction hereinafter) is substantially aligned to the longitudinal direction (i.e., front-back direction, or the direction of the shorter side of the housing 40).

For example, when the power terminal is punched out from a metal plate having thickness of 0.64 mm and the signal terminal is punched out from a metal plate having thickness of 0.4 mm, a width W2a of the insertion portion 43a is 0.64 mm and a width W1a of the insertion portion 44a is 0.4 mm in the lateral direction.

Therefore, when the punched-out terminals are used as the terminals 41, the positional accuracy against the through-hole 32 (33, 34) is improved, in comparison to the case where the terminals are formed by bending a rod member (i.e., a linear metal). In the present embodiment, the punched-out terminals are made of a metal coated brass.

Figure 10:
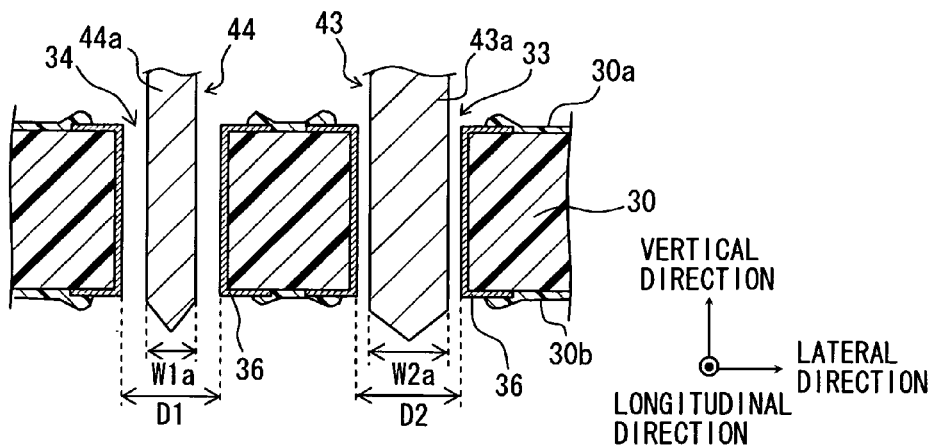
FIG. 10 is a cross sectional view of the electronic device along an X-X line in FIG. 9.

In addition, the cross-section of the insertion portion 43a of the power terminal 43 and the insertion portion 44a of the signal terminal 44 has a shape shown in FIG. 9 in the direction along the surface 30a of the substrate 30 (i.e., the direction that is perpendicular to the vertical direction) in the present embodiment. Among the "along-the-surface" directions described above, the width W2a of the insertion portion 43a of the power terminal 43 and the width W1a of the insertion portion 44a of the signal terminal 44 fulfills a following relationship of dimension $W2a > W1a$ in the lateral direction (i.e., the thickness direction) as shown in FIGS. 9 and 10. That is, in the lateral direction, the width W2a is longer than the width W1a.

In addition, through-hole 33 in which the insertion portion 43a of the power terminal 43 is inserted and the through-hole 34 in which the insertion portion 44a of the signal terminal 44 is inserted have a circular shape long-the-surface cross section (i.e., a cross section perpendicular to the vertical direction). Further, as shown in FIGS. 9 10, a diameter D2 of the power through-hole 33 in which the insertion portion 43a of the power terminal 43 is inserted and a diameter D1 of the signal through-hole 34 in which the insertion portion 44a of the signal terminal 44 is inserted fulfills a following relationship of dimension $D2 > D1$ in the lateral direction (i.e., the thickness direction). That is, the diameter D2 is longer than the diameter D1.

In summary, in the lateral direction (i.e., the thickness direction), the dimensional relationships $W2a > W1a$ and $D2 > D1$ are fulfilled in the configuration of the through-holes 33, 34 and the insertion portions 43a, 44a of terminals 43, 44. Therefore, the power terminal 43 is equivalent to the second terminal in claims, and the signal terminal 44 is equivalent to the first terminal in claims. In addition, the through-hole 33 in which the insertion portion 43a of the power terminal 43 is inserted is equivalent to the second through-hole in claims, and the through-hole 34 in which the insertion portion 44a of the signal terminal 44 is inserted is equivalent to the first through-hole in claims.

Furthermore, the through-holes 33, 34 and the insertion portions 43a, 44a of the terminals 43, 44 are configured to fulfill the dimensional relationship of $W2a - W1a > D2 - D1$ in the lateral direction (i.e., the thickness direction) in the present embodiment, as shown in FIGS. 9 and 10. In other words, dimension difference between the through-hole 33 and the through-hole 34 is smaller than dimension difference between the insertion portion 43a and the insertion portion 44a.

By devising the above configuration, the following advantages against the conventional configuration (i.e., $W2 - W1 \leq D2 - D1$ in an entire circumference of the through-holes 33, 34) are achieved.

When the connector 13 is mounted on the substrate 30, at first the pasted solder 14 is applied to the surface 30a of the substrate 30 by screen-printing. In the course of application, the solder 14 is filled in both of the through-holes 33, 34 to a predetermined depth, as well as pasted on the land 36 at the surface 30a side of the substrate 30 (denoted as "surface" hereinafter). In addition, a part of the solder 14 pasted on the surface of the land 36 is drawn into the through-holes 33, 34 at a time of insertion of the terminals 43, 44, and the solder 14 in a melted condition is further sucked into the through-holes 33, 34 at a time of reflow.

Figure 1B:
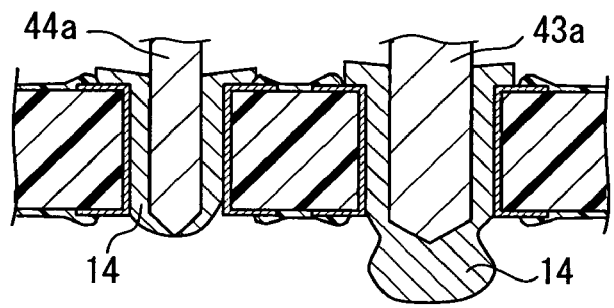
Figure 1C:
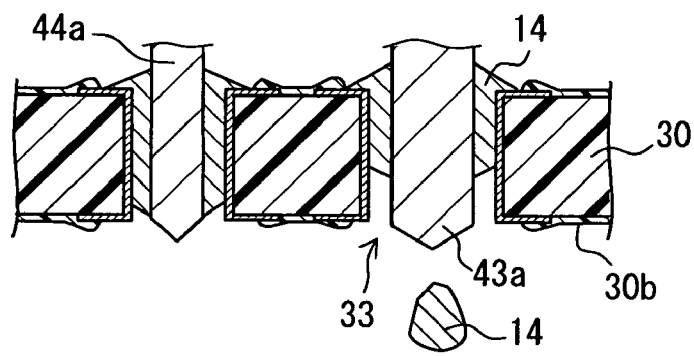

In the conventional configuration, the dimension difference between the through-hole 33 and the through-hole 34 is greater than the dimension difference between the insertion portion 43a and the insertion portion 44a, to fulfill the relationship of $D1 - W1 \leq D2 - W2$ in an entire circumference. Due to the big dimension difference between the two through-holes 33, 34, which is greater than the dimension difference between the two insertion portions 43a, 44a, the depth of the solder 14 in the larger through-hole 33 is increased when the solder application amount is increased, as shown in FIGS. 1A to 1C, and the solder 14 may drop out from the through-hole 33 under pressure of the insertion portion 43a (corresponding to the insertion portion 43a of the power terminal 43 in the present embodiment).

Figure 2A:
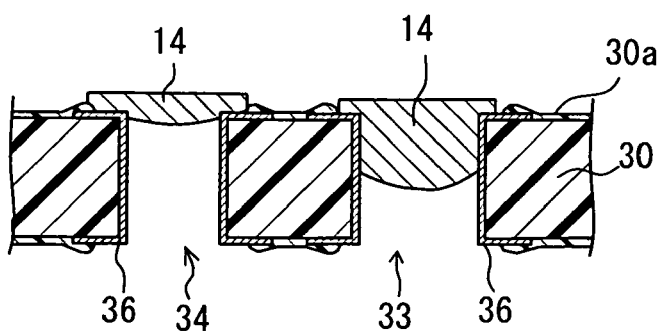
FIGS. 2A to 2C are other cross sectional views of an electronic device for illustrating a conventional manufacturing process of the device having an insertion mounting structure in a screen printing step, in a connector mounting step, and in a reflow step.
Figure 2B:
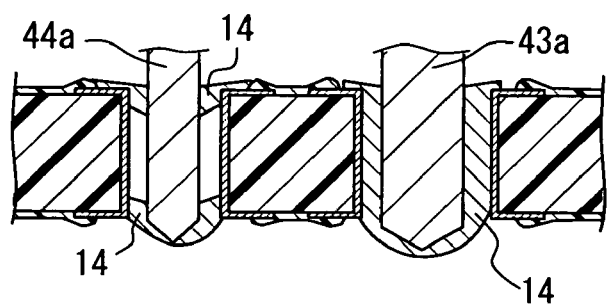
Figure 2C:
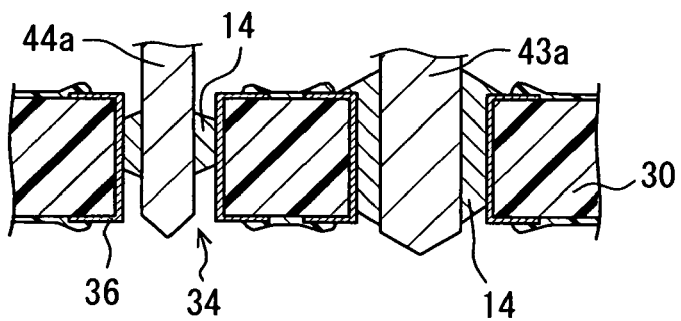

Further, when the solder application amount is decreased, as shown in FIGS. 2A to 2C, the amount of the solder 14 in the smaller through-hole 34 becomes insufficient, to secure the connection reliability between the insertion portion 44a (corresponding to the insertion portion 44a of the signal terminal 44 in the present embodiment) and the land 36.

Figure 11A:
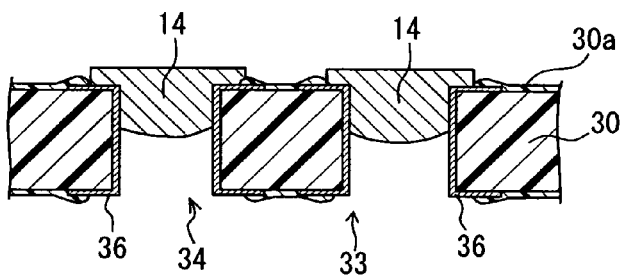
FIGS. 11A to 11C are cross sectional views of the electronic device for showing a mounting process of the device on a circuit board in a screen printing step, in a connector mounting step, and in a reflow step.

On the other hand, in the present embodiment, the dimension difference between the through-holes 33, 34 is smaller than the dimension difference between the insertion portions 43a, 44a in the lateral direction (i.e., the thickness direction) as described above. In other words, the dimension difference between the through-holes 33, 34 is decreased than the conventional configuration. That is, the dimension difference between the through-holes 33, 34 is smaller than the conventional configuration. Therefore, as shown in FIG. 11A, the difference between two depths, that is, between the solder depth (i.e., filling amount of the solder 14) in the power through-hole 33 and the solder depth (i.e.; filling amount of the solder 14) in the through-hole 34, is decreased in comparison to the conventional configuration.

In this manner, while the solder amount (i.e., depth of the solder) in the signal through-hole 34 is adjusted to secure the connection reliability between the signal terminal 44 (i.e., the insertion portion 44a) and the land 36, the solder amount (i.e., depth of the solder) in the power through-hole 33, which is bigger than the through-hole 34, is adjusted to prevent the drop-off of the solder 14 at a time of insertion of the insertion portion 43a of the power terminal 43 or at a time of reflow after the insertion.

Figure 11B:
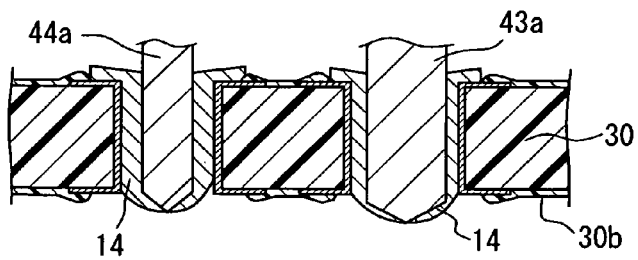
Figure 11C:
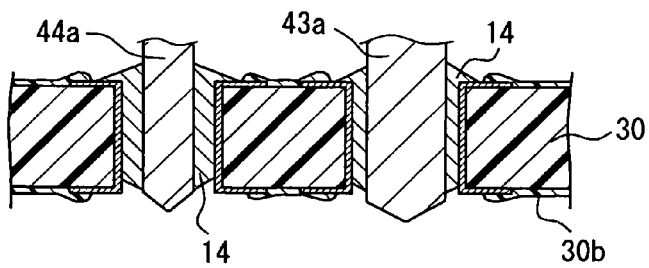

Therefore, as shown in FIG. 11B, the solder 14 will not drop off from the through-holes 33, 34 even when the insertion portions 43a, 44a of the terminals 43, 44 are inserted in the through-holes 33, 34, and, as shown in FIG. 11C, the solder 14 will not drop off from the through-holes 33, 34 even when the reflow is performed. Further, the connection reliability between the insertion portions 43a, 44a of the terminals 43, 44 and the land 36 is secured in both of the through-holes 33, 34.

Thus, the ECU 10 in the present embodiment prevents the drop-off of the solder 14 and secures the connection reliability between the terminals 43, 44 and the land 36, even when (a) the connector 13 in the ECU 10 has multiple terminals having respectively different cross section sizes and (b) the terminals 43, 44 are soldered to the land 36 on the wall of the through-hole by the reflow process. In addition, the above advantages are expected when the relationships W1<W2, D1<D2 and W2−W1>D2−D1 are fulfilled in both of the thickness direction and the width direction.

The ECU 10 has at least the above-described advantageous effects. In the present embodiment, the electronic components 31 and the connector 13 having the insertion mount structure are mounted on the surface 30a of the substrate 30 by the same reflow process in addition to the above configuration. In this manner, the manufacturing process is simplified.

In addition to the above-described configuration, the width W2b of the insertion portion 43a of the power terminal 43 in the longitudinal direction (i.e., the width direction) has the same dimension as the width W1b of the insertion portion 44a of the signal terminal 44 (i.e., W2b=W1b) in the longitudinal direction as shown in FIG. 9 in the present embodiment. Because the through-holes 33, 34 have circular cross sections, the above relationship is translated to the dimension relationship of W2−W1<D2−D1 between the through-holes 33, 34 and the insertion portions 43a, 44a of the terminals 43, 44.

The above relationship W2−W1>D2−D1 can also be written as D1−W1>D2−W2. In this inequality, D1−W1 means "a gap" between the through-hole 34 and the insertion portion 44a of the signal terminal 44, and D2−W2 means "a gap" between the through-hole 33 and the insertion portion 43a of the power terminal 43. Therefore, the above expression of relationship means that a gap of the signal terminal 44 side is larger than the gap of the power terminal 43 side.

Therefore, when the relationship of W2−W1>D2−D1 is fulfilled in both of the lateral direction (i.e., the thickness direction) and the longitudinal direction (i.e., the width direction), the gap between the through-hole 34 having the smaller diameter D1 and the insertion portion 44a of the signal terminal 44 becomes smaller in the entire circumference of the insertion portion 44a. Thus, a connection length of the insertion portion 44a of the signal terminal 44 to the land 36 by the solder 14 becomes shorter in the vertical direction.

In the present embodiment, in contrast, the relationships W1<W2, D1<D2 and W2−W1>D2−D1 are configured to be fulfilled only in one (i.e., lateral) direction from among the two (i.e., lateral/longitudinal) directions. Therefore, the connection length between the signal terminal 44 and the through-hole 34 by the solder 14 is increased, thereby improving the connection reliability between the insertion portion 44a of the signal terminal 44 and the land 36 in the present embodiment. In this case, the same advantageous effects are expected by a configuration that has the above relationships of W1<W2, D1<D2 and W2−W1>D2−D1 fulfilled only in the width direction instead of only in the thickness direction.

In addition to the above-described configuration, the terminals 41 (43, 44) are formed as punched-out terminals in the present embodiment. The thickness of the board used to form the punched-out terminals is determined based on the engagement with the connector on the external device side. Further, in order to have the widths of the insertion portions 43a, 44a in the thickness direction (i.e., the widths W1a, W2a in the present embodiment) different from the widths of the other portions of the terminals 43, 44 in the thickness direction, the insertion portions 43a, 44a may be hammered to have a thinner form. However, the insertion portions 43a, 44a may become fragile, and/or dimension precision may deteriorate in the thickness direction when such a process is performed. That is, in other words, the widths of the terminals 43, 44 in the thickness direction have a smaller degree of dimension freedom than that in the width direction.

In the present embodiment, in contrast, the relationships W1<W2, D1<D2 and W2−W1>D2−D1 are configured to be fulfilled only in the thickness direction, which has a smaller dimension freedom among the thickness direction and the width direction, and the above relationships are configured not to be fulfilled in the width direction, which has a greater dimension freedom than the thickness direction. Therefore, while preventing embrittlement and/or deterioration of dimension precision of the insertion portions 43a, 44a, the connection length of the solder 14 between the signal terminal 44 and the through-hole 34 having a smaller hole diameter is increased, thereby improving the connection reliability between the terminal 44 and the land 36.

In addition to the above-described configuration, among the two terminals 43, 44 having respectively different cross sections, the signal terminal 44 formed as the first terminal shown in FIG. 9 is configured to have a longer dimension W1b in the longitudinal direction (i.e., width direction) than a dimension W1a in the lateral direction (i.e., thickness direction).

By having the above configuration, the gap between the through-hole 34 and the insertion portion 44a of the signal terminal 44 becomes narrower in the longitudinal direction (i.e., width direction) than in the lateral direction (i.e., thickness direction). Therefore, while fulfilling the relationships W1a<W2a, D1<D2 and W2a−W1a>D2−D1 in the lateral direction (i.e., the thickness direction), the gap between the through-hole 34 and the insertion portion 44a of the signal terminal 44 is decreased, thereby increasing the connection, length of the solder 14 between the insertion portion 44a of the signal terminal 44 and the through-hole 34, leading to the improvement of the connection reliability between the terminal 44 and the land 36.

In addition to the above-described configuration, the terminals 43; 44 having respectively different cross sections have those cross sections shaped in an octagon as shown in FIG. 9 in the present embodiment. The octagonal shape cross sections of the insertion portions 43a, 44a are seen when the cross sections are taken in a direction along the surface 30a of the substrate 30.

When the cross section has a polygonal shape, the narrowest portions of the gap between the insertion portions 43a, 44a and the through-holes 33, 34 are found at the corners of the polygonal shape. For example, as shown in FIG. 12B, the gap between the through-hole 34 and the insertion portion 44a having a generally square cross section shape is greater at four sides between corners than at four corners.

Figure 12A:
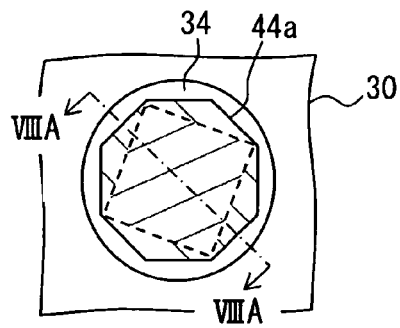
FIGS. 12A and 12B are cross sectional views of the terminal and the corresponding through-hole in the embodiment of the present invention and in a comparison example.
Figure 12B:
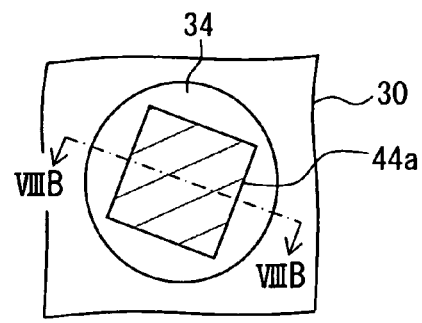
Figure 13A:
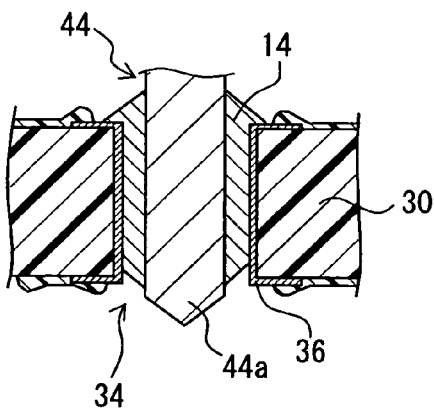
FIGS. 13A and 13B are cross sectional views of the terminal and the through-hole along a XIIIA-XIIIA line in FIG. 12A and a XIIIB-XIIIB line in FIG. 12B.
Figure 13B:
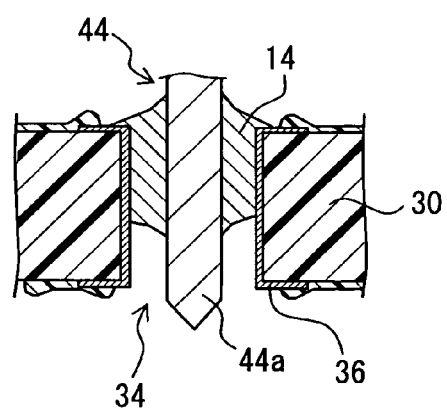

In the present embodiment, in contrast, the octagonal shape cross section of the insertion portion 44a makes the gap at each of eight sides narrower than the gap at four sides of the square shape cross section, as shown in FIG. 12A. Therefore, as shown in FIG. 13A, the connection length of the solder 14 is increased than the case shown in FIG. 13B, and the connection reliability of the terminals 41 (43, 44) with the land 36 is improved. The illustration in FIG. 12A shows the square shape cross section of the insertion portion 44a also appearing in FIG. 12B by using a broken line. Further, though the above example describes the insertion portion 44a of the signal terminal 44 only, the same discussion applies to the insertion portion 43a of the power terminal 43.

The above-described effects can be expected when the cross section of the insertion portion is in a polygonal shape having the number n of side greater than four (i.e., n>4). However, a production cost of the terminals 43, 44 can be decreased than other polygonal shapes, because the insertion portions 43a, 44a of the terminals 43, 44 having the octagonal cross section can be more easily formed by cutting each of four corners of the terminals that are punched out from the metal plate. In addition, the octagonal shape may include a "pseudo" octagonal shape. For example, the terminals 43, 44 having an approximately octagonal cross section that have four corners of the rectangle hammered and rounded are expected to achieve substantially the same effects.

Figure 14:
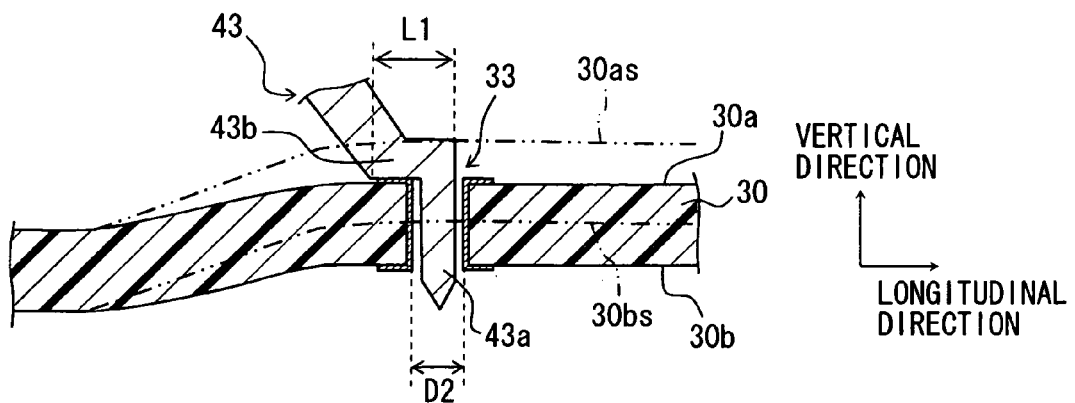
FIG. 14 is a cross sectional view of the terminal and the through-hole for illustrating merits of a stopper.

In addition to the above-described configuration, the power terminal 43 and the signal terminal 44 in the present embodiment have one of their two ends respectively connected to the insertion portions 43a, 44a, and have stoppers 43b, 44b which extend in a perpendicular direction relative to an extending direction of the insertion portions 43a, 44a as shown in FIG. 8. In the present embodiment, the stoppers 43b, 44b extend in the longitudinal direction that is same as the board width direction of the metal plate. Further, as shown in FIG. 14, the maximum dimension L1 of the width of the stopper 43b in that maximum dimension direction along the surface 30a of the substrate 30 (i.e., in the longitudinal direction in FIG. 14) is longer than the diameter D2 of the through-hole 33. In addition, the illustration in FIG. 14 shows only an example of the power terminal 43 side, the same applies to the signal terminal 44 side.

In case that the surface 30a side of the substrate 30 has a convex warp, the insertion portions 43a, 44a of the terminals 43, 44 will be inserted in the through-holes 33, 34 until the locking part 42a of the hook pin 42 mentioned above goes through the through-hole 35 to be engaged with the backside 30b for fixing the connector 13 on the substrate 30 at a predetermined position, if the stopper 43b, 44b are formed. As a result, tips of the respective terminals 43, 44 protrude from the back side 30b of the substrate 30 by a large margin.

In other words, the positions of the tips of the terminals 43, 44 vary relative to the backside 30b of the substrate 30, depending on the warp of the substrate 30. For example, even when the condition of the screen-printing is same, the solder 14 may drop more easily from the substrate 30 in case that the protrusion of the tips of the terminals 43, 44 from the backside 30b of the substrate 30 is greater.

In the present embodiment, in contrast, even if the substrate 30 has a convex warp on its surface 30a side, the stoppers 43b, 44b of the terminals 43, 44 (e.g., the stopper 43b of the power terminal 43 in FIG. 14) contact the convex warp of the substrate 30 to press the substrate 30 until the connector 13 comes to a predetermined position of mounting relative to the substrate 30, for correcting the convex warp of the substrate 30. Therefore, the positional variations of the tips of the terminals 43, 44 relative to the backside 30b of the substrate 30 are suppressed, thereby preventing troubles such, as the drop-off of the solder 14. In FIG. 14, the substrate 30 in a warped condition is shown by using a two-dotted line, and the substrate 30 in a corrected condition is shown by using a solid line. Further, in FIG. 14, a numeral 30 as represents a surface of the substrate 30 in the warped condition, and a numeral 30bs represents a back side of the substrate 30 in the warped condition.

Modification Example 1

Figure 15:
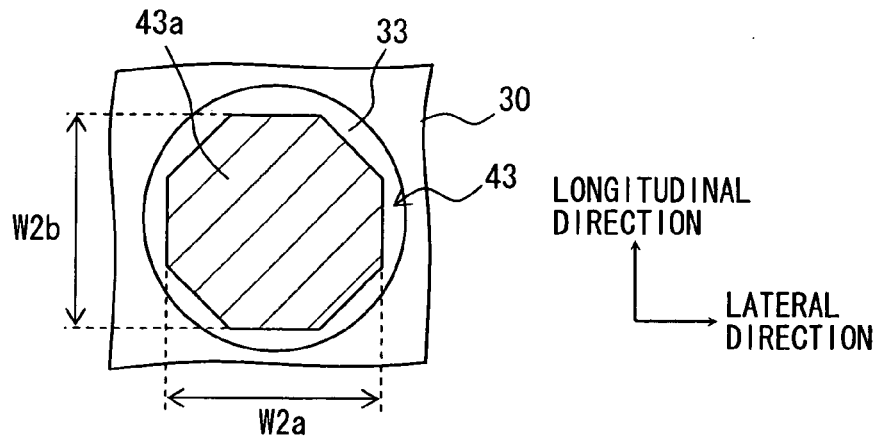
FIG. 15 is a cross sectional view of a modification of an insertion portion of the power terminal.

In the above embodiment, regarding the second terminal serving as the power terminal 43, a relationship between the width W2a in the lateral direction (i.e., the thickness direction) and the width W2b in the longitudinal direction (i.e., the width direction) of the insertion portion 43a is not mentioned. However, among the two terminals 43, 44 having respectively different cross sections, it is preferable that the power terminal 43 has a configuration that the width W2a in the lateral direction (i.e., the thickness direction) is equal to the width W2b in the longitudinal direction (i.e., the width direction) as shown in FIG. 15.

When the terminal 43 has the above configuration, the gap between the through-hole 33 and the insertion portion 43a of the power terminal 43 has substantially the same dimension in the longitudinal direction (i.e., the width direction) and in the lateral direction (i.e., thickness direction). Therefore, while fulfilling the relationships of W1a<W2a, D1<D2 and W2a−W1a>D2−D1 in the lateral direction (i.e., the thickness direction), the gap between the through-hole 33 and the insertion portion 43a of the power terminal 43 is decreased, thereby increasing the connection length of the solder 14 between the power terminal 43 and the land 36 and improving the connection reliability of the terminal 43 and the land 36.

Modification Example 2

In the above embodiment, the stoppers 43b, 44b extend only in a backward direction of the longitudinal directions (i.e., the width direction) from an end of the substrate surface side of the insertion portions 43a, 44a. In other words, a connection structure involving the insertion portions 43a, 44a and the stoppers 43b, 44b has an L shape approximately.

Figure 16:
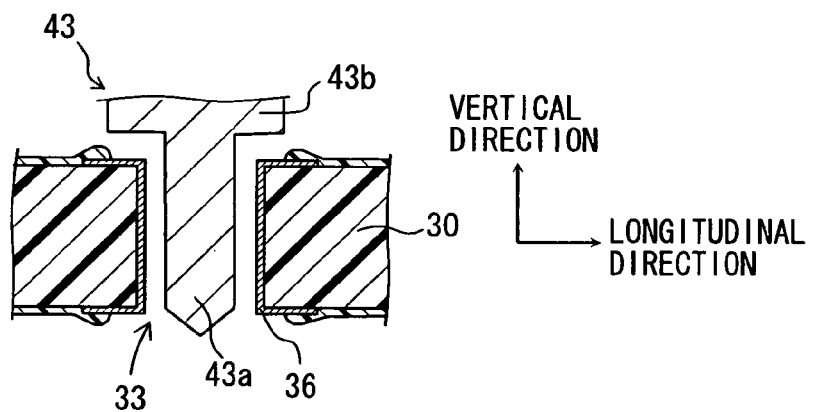
FIG. 16 is a cross sectional view of a modification of the stopper.

However, the stoppers 43b, 44b may be arranged differently. For example, as shown in FIG. 16, the stopper 43b may extend in both of the forward direction and the backward direction from the end of the board surface side of the insertion portion 43a, among the longitudinal directions (i.e., the width direction). In other words, the connection structure involving the insertion portion 43a and the stopper 43b may have a T shape. In addition, though only the power terminal 43 side is illustrated in FIG. 16, the same applies to the signal terminal 44 side.

Modification Example 3

Figure 17A:
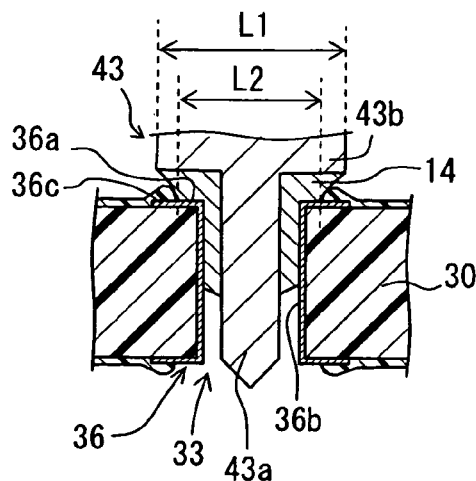
FIGS. 17A and 17B are cross sectional views of the terminal and the through-hole for illustrating a relationship between a length of the stopper and a length of a surface portion of a land.

In the above embodiment, the maximum length L1 of the stoppers 43b, 44b is not mentioned in particular. For example, as shown in FIG. 17A, if the maximum length L1 of the width of the stopper 43b is longer than a distance L2 between two extremes of an outer periphery of a surface portion 36a of the land 36, the melted solder 14 in the reflow process may be kept by a greater amount due to the capillary phenomenon between the stopper 43b and the surface portion 36a of the land 36, thereby decreasing the amount of the solder 14 flowing into the through-hole 33. In other words, the connection length by the solder 14 between the wall portion 36b of the land 36 and the insertion portion 43a of the power terminal 43 is decreased.

Figure 17B:
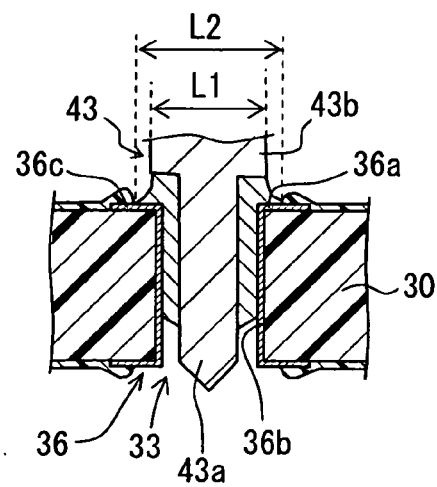

In contrast, as shown in FIG. 17B, if the maximum length L1 of the width of the stopper 43b is shorter than the distance L2 between two extremes of an outer periphery of the surface portion 36a of the land 36, the melted solder 14 kept between the stopper 43b and the surface portion 36a of the land 36 is decreased in the reflow process, thereby increasing the amount of the solder 14 flowing into the through-hole 33. In this manner, the connection length by the solder 14 between the wall portion 36b of the land 36 and the insertion portion 43a of the power terminal 43 is increased and the connection reliability is improved. In addition, though only the power terminal 43 side is illustrated in FIG. 17, the same applies to the signal terminal 44 side.

In addition, the surface section 36a of the land 36 means a portion of the land 36 existing on the surface 30a of the substrate 30 and being exposed from the solder resist, and the wall portion 36b means a portion of the land 36 that is formed on a wall surface of the through-holes 33, 34. A numeral 36c in FIG. 17A/B is a portion of the land 36 on the surface 30a of the substrate covered by the solder resist. That is, illustrations in FIG. 17A/B show an over resist structure, in which the land 36 existing on the surface 30a of the substrate 30 is partially covered by the solder resist. However, a normal resist structure, in which the land 36 existing on the surface 30a of the substrate 30 is entirely exposed, may be adopted.

Modification Example 4

Figure 18:
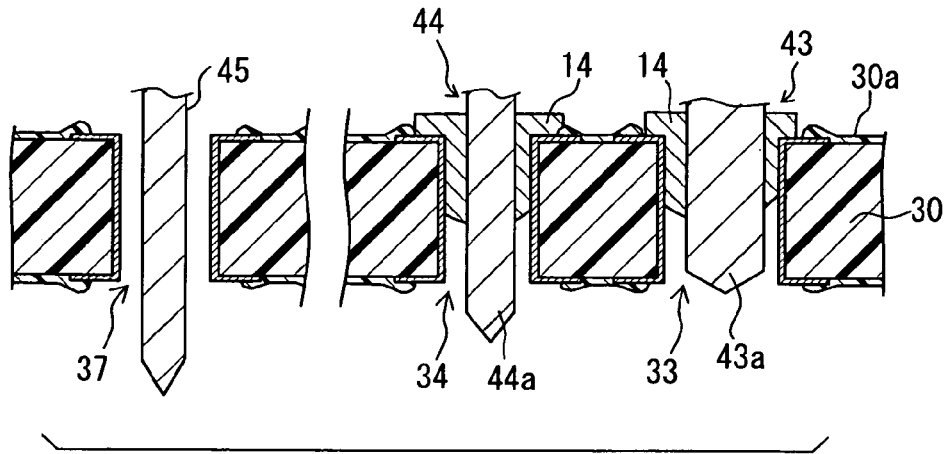
FIG. 18 is a cross sectional view of the terminal and the through-hole for illustrating a relationship between a length of the terminal and a length of a position pin.

In the above embodiment, a relationship between the two terminals 43, 44 regarding the length of the insertion portions 43a, 44a from the surface 30a of the substrate 30 to the tip of the insertion portions 43a, 44a in the inserted condition of those portions 43a, 44a is not mentioned. The illustration in FIG. 18 shows that it may be preferable to make an insertion length of the insertion portion 44a longer than an insertion length of the insertion portion 43a. In other words, it is preferable that the insertion portion 44a of the signal terminal 44 having a smaller cross section is longer than the insertion portion 43a of the power terminal 44 having a greater cross section, at a portion between the stoppers 43b, 44b and the tip of the insertion portions 43a, 44a.

The reason for the preference is that the signal terminal 44 (i.e., the first terminal) having lower rigidity is inserted in the through-hole 34 prior to the insertion of the power terminal 43 (i.e., the second terminal) having higher rigidity. Thus, the insertion force for inserting the terminals 41 is adjusted so that the insertion force for inserting the longer and less rigid insertion portion is made weaker than the insertion force for inserting the shorter and more rigid insertion portion. That is, an early insertion force can be made weaker than a late insertion force. In this manner, the scratch or the like on the land 36 formed on the wall of the through-holes 33, 34 can be prevented.

Modification Example 5

In the example shown in FIG. 18, the connector 13 has a position pin 45 that extends vertically at a tip portion and is held by the housing 40 of the connector 13 at a base portion. The substrate 30 has a through-hole 37 for accepting the positioning pin 45, which is formed separately from the through-hole 32. The length of the positioning pin 45 from the surface 30a of the substrate 30 to the tip of the insertion portion may be made longer than the length of the terminals 41 (i.e., the power terminal 43 and the signal terminal 44) from the surface 30a of the substrate 30 to the tip of the insertion portion.

In the above embodiment, in at least one of the two along-the-surface directions (i.e., the lateral (thickness) direction and the longitudinal (width) direction), the gap between the insertion portion 43a of the power terminal 43 and the through-hole 33 is smaller than the conventional configuration, thereby leading to an increase of the insertion force for inserting the power terminal 43 in the through-hole 44 to mount the connector 13 on the substrate 30, relative to the conventional insertion operation.

In the present embodiment, in contrast, the position of the connector 13 in the along-the-surface directions can be corrected on the surface 30a of the substrate 30 by inserting the position pin 45 in the through-hole 37 before inserting the terminals 41 (i.e., the power terminal 43 and the signal terminal 44) in the through-holes 32 (33, 34) when the configuration shown in FIG. 18 is adopted. Therefore, the power terminal 43 can be accurately inserted in the through-hole 33, and the increase of the insertion force can be restrained.

In addition, when (a) the number of the power terminals 43 is smaller than the number of the signal terminals 44 regarding the terminals 41 held by the housing 40 of the single connector 13 and (b) the amount of the total insertion force for the power terminals 43 (=the insertion force per terminal multiplied by the number of terminals 43) is smaller than the amount of the total insertion force for the signal terminals 44 (=the insertion force per terminal multiplied by the number of terminals 44), the power terminal 43 may be made longer than the signal terminal 44.

Modification Example 6

Figure 19:
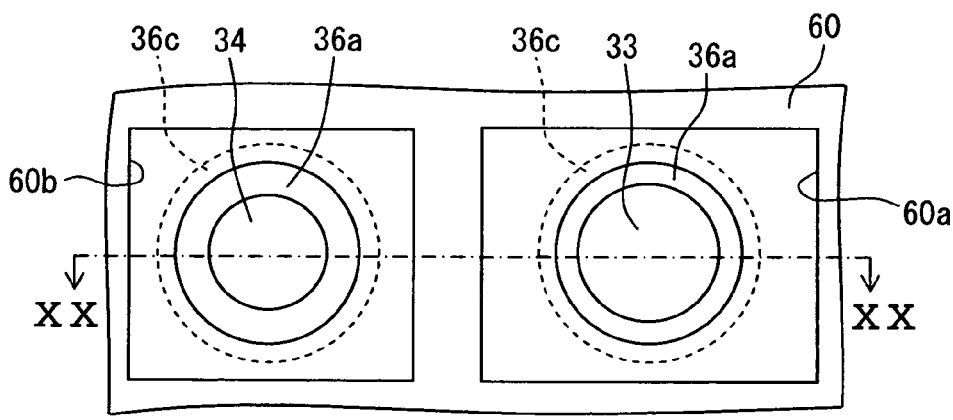
FIG. 19 is a top, view of the terminal, the through-hole and a metal mask for illustrating a modification of the screen printing process.
Figure 20:
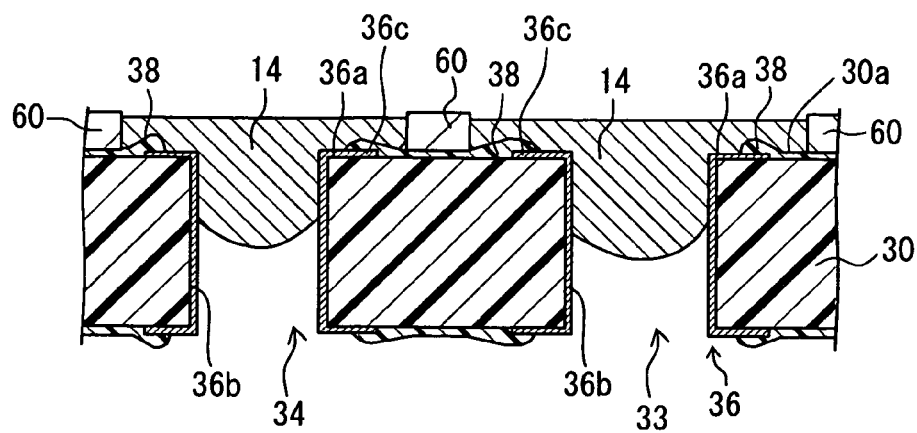
FIG. 20 is a cross sectional view of the circuit board, along a XX-XX line in FIG. 19.

In the above embodiment, the solder application area of the solder 14 on the surface 30a of the substrate 30 in the screen-printing process is not mentioned. However, preferably, as shown in FIGS. 19 and 20, the solder 14 in a pasted form may be applied not only on the surface portion 36a of the land 36 that is exposed from a solder resist 38, but also on the solder resist 38 around the surface portion 36a. For example, as shown in FIGS. 19 and 20, among the land 36 located on the surface 30a of the substrate 30, a portion covered by the solder resist 38 may have an application of the solder 14 in a pasted form on top of the solder resist 38 in an over resist structure. In a normal resist structure, the solder 14 in a pasted form may be applied on the solder resist 38 around the surface portion 36a of the land 36.

In addition, in FIGS. 19 and 20, a numeral 60 represents a metal mask, a numeral 60a represents an opening of the metal mask 60 on a through-hole 33 side, and a numeral 60b represents an opening of the metal mask 60 on a through-hole 33 side, respectively.

When such a manufacturing method is adopted; at a time of reflow process, the melted solder 14 on the solder resist 38 is drawn by the solder 14, which is flowing into the through-holes 33, 34 due to a capillary phenomenon, to be dragged into the through-holes 33, 34. In this manner, an increased amount of the solder 14 is supplied into the through-holes 33, 34 from the surface 30a of the substrate 30, thereby enabling an improvement of the connection reliability of the terminals 41 (i.e., the power terminal 43 and the signal terminal 44) and the land 36.

In addition, as the through-hole 33 in which the power terminal 43 is inserted has a greater opening area size than the through-hole 34 in which the signal terminal 44 is inserted, the opening area size of the opening 60a is made greater than the opening area size of the opening 60b in FIGS. 19 and 20. In addition, the print area size on the surface 30a of the substrate 30 is made greater on the power side than the print area size on the signal side. In this case, the print area size is calculated as a difference of area sizes on the power side for example, by subtracting the opening area size of the through-hole 33 from the opening area size of the opening 60a.

Although the present disclosure has been fully described in connection with preferred embodiment thereof with reference to the accompanying drawings, it is to be noted that various changes and modifications will become apparent to those skilled in the art.

As an electronic device, the ECU 10 is not limited to the non-waterproofing structure. That is, the present invention can be applied to the ECU having a waterproofing structure. Also, the present invention can be applied to a device other than an ECU.

The multiple kinds of terminals having respectively different cross sections are not limited to the power terminal 43 and the signal terminal 44. For example, the signal terminal 44 may have two or more kinds of terminals having respectively different cross sections. Further, the terminals 41 may have three or more kinds with respectively different cross sections. In that case, the two or more kinds of terminals having respectively different cross sections and the through-holes accepting those terminals may be formed to fulfill, in at least one of the along-the-surface directions on the surface 30a of the substrate 30, relationships of W1<W2, D1<D2 and W2−W1>D2−D1, when (a) the widths of the insertion portions of the first and second terminals among arbitrary-chosen two terminals are designated as W1, W2, and (b) the "land-including" diameters of the lands in which the insertion portions of the first and second terminals are inserted are designated as D1, D2.

Such changes, modifications, and summarized schemes are to be understood as being within the scope of the present disclosure as defined by appended claims.

What is claimed is:

1. An electronic device comprising:
a substrate having a plurality of through-holes that pierce both sides of the substrate with lands formed on walls of the plurality of through-holes; and
a connector having a housing made of electricity insulating material, the housing holding a part of each of a plurality of terminals, each of the plurality of terminals having another part defined as an insertion portion that is inserted in each of the plurality of through-holes, wherein
the insertion portions of the plurality of terminals are inserted in respectively different through-holes to be soldered to the lands on the walls of the through-holes,
the connector has a plurality of terminals in respectively, different plural kinds, each of the plurality of terminals punched out from a metal plate of predetermined thickness,
the plurality of terminals have, as the insertion portions, respectively different along-the-surface cross sections that are in parallel with the surface of the substrate,
conditions of W1<W2, D1<D2, and W2−W1>D2−D1 are fulfilled as a relationship between the plural kinds of terminals having respectively different cross sections and the plurality of through-holes in which the insertion portions of the plural kinds of terminals are respectively inserted, when (a) W1 and W2 are respectively defined as widths of the insertion portions of a first and a second terminal that have respectively different cross sections in at least one of two directions along the surface of the substrate, the two directions respectively corresponding to a thickness direction of the metal plate and a cross direction perpendicular to the thickness direction of the metal plate, and (b) D1 and D2 are respectively defined as a hole diameter of a first and a second through-hole in which the insertion portions of the first and the second terminal are inserted, the hole diameter being measured as an inside of the land of the respective through-holes.

2. The electronic device of claim 1, wherein
the conditions of W1<W2, D1<D2, W2−W1>D2−D1 are fulfilled exclusively in one of the plate thickness direction and the cross direction.

3. The electronic device of claim 2, wherein
the conditions of W1<W2, D1<D2, W2−W1>D2−D1 are fulfilled only in the plate thickness direction.

4. The electronic device of claim 3, wherein
the plurality of terminals are provided in only two kinds of terminal,
each of the plurality of through-holes having the two terminal kinds inserted therein has a circular cross section along the surface of the substrate, and
a dimension of the insertion portion of the first terminal along the cross direction is greater than a dimension of the insertion portion along the plate thickness direction.

5. The electronic device of claim 1, wherein
the plurality of terminals are provided in only two kinds of terminal,
each of the plurality of through-holes having the two terminal kinds inserted therein has a circular cross section along the surface of the substrate, and
a dimension of the insertion portion of the first terminal along the cross direction is equal to a dimension of the insertion portion along the plate thickness direction.

6. The electronic device of claim 1, wherein
the plurality of terminals include a signal terminal for signal transmission and a power terminal for power transmission, an area size of the along-the-surface cross section of the power terminal being greater than an area size of the along-the-surface cross section of the signal terminal, and the signal terminal serves as the first terminal and the power terminal serves as the second terminal.

7. The electronic device of claim 1, wherein the connector has, in a pre-soldered condition, a stay for fixing the housing at a predetermined position of a substrate thickness direction relative to the substrate, each of the plurality of terminals has a stopper that has a width greater than the insertion portion in at least one direction along the substrate surface and is connected to a housing-side end of the insertion portion, and a maximum width of the stopper is greater than a hole diameter of the corresponding through-hole having the land when the stopper width is measured along the maximum width.

8. The electronic device of claim 7, wherein the land has a wall portion that is disposed on a wall of the through-hole and a surface portion that surrounds the through-hole on a connector mount surface in connection with the wall portion, and a maximum width of the stopper is smaller than a distance between two extremes of an outer periphery of the solder-accessible surface portion when the distance between two extremes of the surface portion is measured along a measurement direction of the maximum width of the stopper.

9. The electronic device of claim 1, wherein each of the plurality of through-holes having the plurality of terminals inserted therein has a circular along-the-surface cross section, and the insertion portion of each of the plural kinds of terminal has an octagonal along-the-surface cross section.

10. The electronic device of claim 1, wherein a cross section area size of the second terminal is greater than a cross section area size of the first terminal when the area size of the cross section is taken along the surface of the substrate, and an insertion length of the first terminal is greater than an insertion length of the second terminal when the insertion length of the terminal in the corresponding through-hole is measured as a length from a connector mount surface of the substrate to a tip of the inserted terminal.

11. The electronic device of claim 1, wherein the connector has a position pin that has a base portion held by the housing and a tip portion extending along a substrate thickness direction, the substrate has a pin-accepting hole in addition to the through-holes for accepting the plurality of terminals, and an insertion length of the position pin is greater than an insertion length of the plurality of terminals when the insertion length is measured as a length of the position pin or the plurality of terminals from a connector mount surface of the substrate to a tip of the inserted position pin or the plurality of terminals.

12. The electronic device of claim 1, wherein the substrate has electronic components that are surface-mounted on a connector mount surface.

* * * * *